United States Patent [19]

Margeson, III

[11] Patent Number: 5,473,572
[45] Date of Patent: Dec. 5, 1995

[54] POWER SAVING SYSTEM FOR A MEMORY CONTROLLER

[75] Inventor: James E. Margeson, III, Santa Clara, Calif.

[73] Assignee: Chips and Technologies, Inc., San Jose, Calif.

[21] Appl. No.: 326,134

[22] Filed: Oct. 18, 1994

Related U.S. Application Data

[63] Continuation of Ser. No. 17,728, Feb. 16, 1993, abandoned.

[51] Int. Cl.$^6$ ..................................................... G11C 7/00
[52] U.S. Cl. ........................... 365/227; 365/226; 365/236
[58] Field of Search .................................... 365/226, 227, 365/198, 230.08, 233, 236

[56] References Cited

U.S. PATENT DOCUMENTS 4,381,552  4/1983  Nocilini et al. .......................... 365/227

Primary Examiner—David C. Nelms
Assistant Examiner—F. Niranjan
Attorney, Agent, or Firm—Benman Collins & Sawyer

[57] ABSTRACT

A memory controller is provided in which the address path is disabled by a sequencer to reduce power consumption when the sequencer is in an IDLE mode. When access is requested by the bus, the sequencer changes into an ALERT mode, thereby enabling the address path. Subsequently the sequencer then changes into an EXECUTE mode to perform data transfer operations. After the transfer is completed, the sequencer returns to the ALERT mode and an inactive time counter begins counting. If no access is requested before the counter reaches a predetermined number of counts, the sequencer returns to the IDLE mode and the address path is disabled to save power. However, if another cycle request occurs while in the ALERT mode, the EXECUTE mode is entered into immediately.

6 Claims, 5 Drawing Sheets

POWER SAVING SYSTEM FOR A MEMORY CONTROLLER

This is a continuation of application Serial No. 08/017,728 filed on Feb. 16, 1993, now abandoned.

FIELD OF THE INVENTION

The present invention is directed to memory controllers and more particularly to reducing power consumption in such controllers.

BACKGROUND OF THE INVENTION

In many memory controllers, particularly dynamic random access memory (DRAM), or video random access memory controllers (VRAM) the address that is asserted from a bus or a CPU must be time multiplexed as a row and column address to be sent to memory. In many cases the address must also be translated. Therefore the memory accesses must be performed in a minimum amount of time. This is important because accessing a memory requires a certain amount of power and power consumption is critical in many computer applications.

In a first prior art implementation, the address translator and the multiplexer path are always enabled. In this embodiment, a valid address begins to propagate to the memory immediately. The advantage of this implementation is that the address begins to propagate through the controller to the memory as soon as the address is valid. The primary disadvantage with this method is that when there are address transitions during unrelated activity on the bus, power is consumed in the input buffer, address translator mux, output buffers and the memory. As has been above mentioned, excessive power consumption is problematic in a portable or laptop computer environment.

A second prior art memory controller implementation disables the input buffer between memory cycles to eliminate the extra power consumption. In many instances a bus will assert a valid address before there is indication that a cycle is starting or that the access will involve the memory controller. Therefore, the memory controller can then detect from the most significant address bits whether it should respond to the access. However, this implementation has the disadvantage that the input buffers are disabled for some period of time after a valid address is available thereby delaying the point in time where the translated address arrives at the memory. Accordingly, the length of the memory access is increased thereby reducing the memory bandwidth.

The present invention overcomes the above-identified problems to produce a memory controller that does not significantly decrease the memory bandwidth and at the same time does not have the power consumption problems unknown with the previously known systems.

SUMMARY OF THE INVENTION

The present invention is directed toward a memory controller in which the address path is disabled by a sequencer to reduce power consumption when the sequencer is in a first mode. When access is requested by the bus, the sequencer changes into a second mode, thereby enabling the address path. Subsequently the sequencer then changes into a third mode to perform data transfer operations. After the transfer is completed, the sequencer returns to the second mode and an inactive time counter begins counting. If no access is requested before the counter reaches a predetermined number of counts, the sequencer returns to the first mode and the address path is disabled to save power. However, if another cycle request occurs while in the second mode, the third mode is entered into immediately.

The present invention utilizes to advantage the fact that accesses to a memory oftentimes are in bursts. In the event that they are not in bursts, an increase in length of the memory access does not consume a significant portion of the bus bandwidth. Therefore, power is saved in the address path during periods of inactivity and memory access time is correspondingly reduced when the memory is accessed frequently.

DETAILED DESCRIPTION OF THE INVENTION

The present invention is an improved system for conserving power within a memory controller. The following description is presented to enable one of ordinary skill in the art to make and use the invention and is presented in the context of a particular application and its requirements. Various modifications to the preferred embodiment will be readily apparent to those of ordinary skill in the art and the generic principles defined herein may be applied to other embodiments and applications without departing from the spirit and scope of the present invention. Thus the present invention is not to be limited to the embodiment shown, but is to be accorded with the widest scope consistent with the principles and features disclosed herein.

Figure 1:
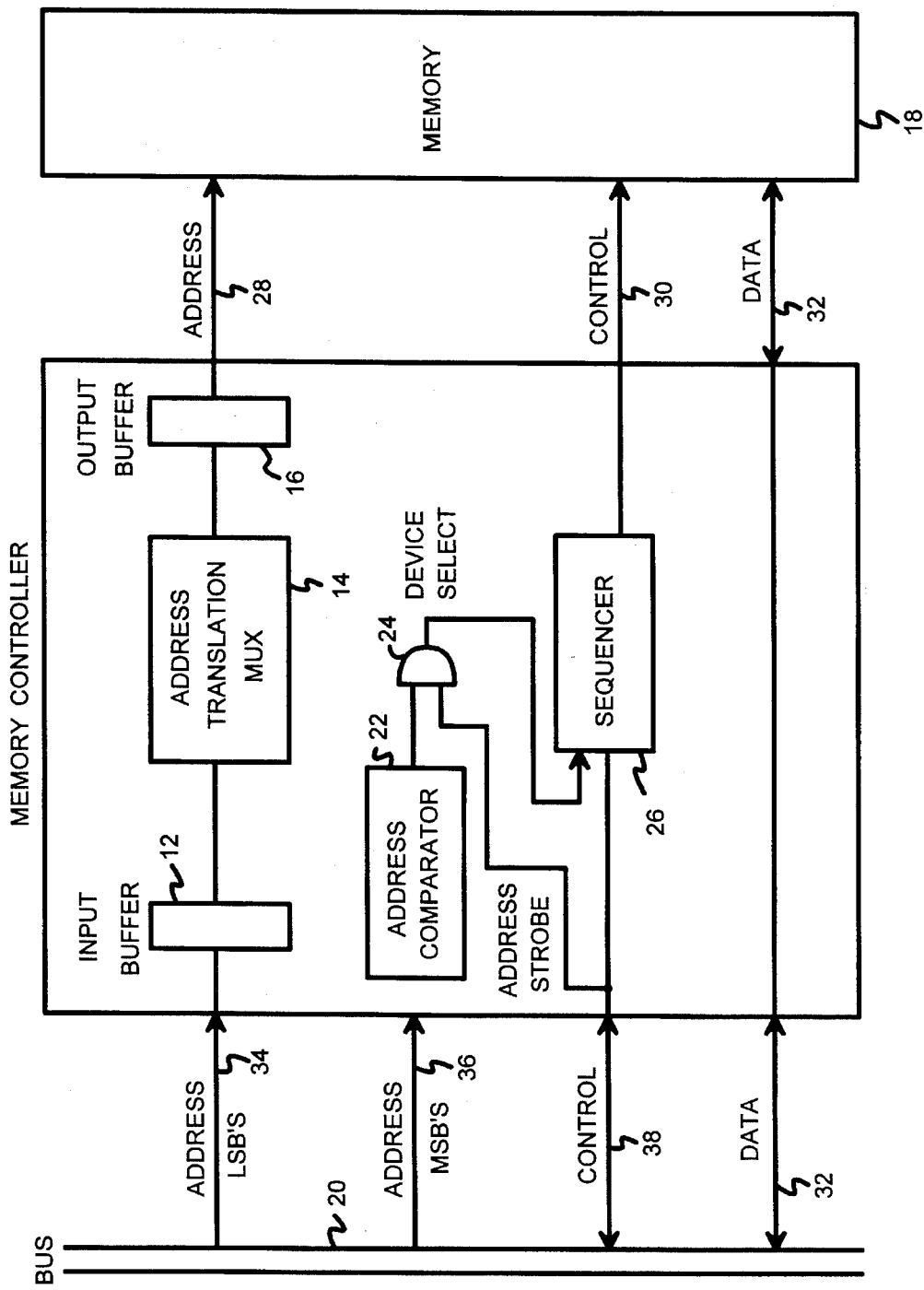
FIG. 1 shows a block diagram of a first prior art memory controller.

Referring now to FIG. 1, what is shown in simple block diagram form is a first prior art embodiment of a memory controller 10 coupled to a bus 20 and a memory 18. The memory controller 10 comprises an address path that includes an input buffer 12 which receives the least significant bits (LSBs) from the bus 20 on line 34. The buffer 12 provides the addresses to the address translation multiplexer 14. The address multiplexer in turn provides those bits to the output buffer 16. Thereafter those address signals are provided to the memory 18 via line 28. The memory controller 10 further comprises an address comparator 22 which receives the most significant bits (MSBs) from the bus 20 via line 36. The address comparator 22 provides an output signal to a first input of an AND gate 24. Control signals via line 38 are provided to a sequencer 26 and to a second input of the AND gate 24. The output of the sequencer 26 provides control signals to the memory 18 via line 32. Finally data passes directly from the bus 20 through the memory controller 10 via lines 32 to the memory 18.

This embodiment operates in the following manner. The input buffer 12 is always enabled due to its connection to the bus via line 34 thereby allowing valid addresses to quickly propagate to the memory 18. The major disadvantage of this embodiment is that the when the address transition during unrelated activity in the bus 20, power is consumed in the other portions of the memory controller 10. This is highly undesirable in applications where power is at a premium, for example in the laptop and notebook computer environment.

Figure 2:
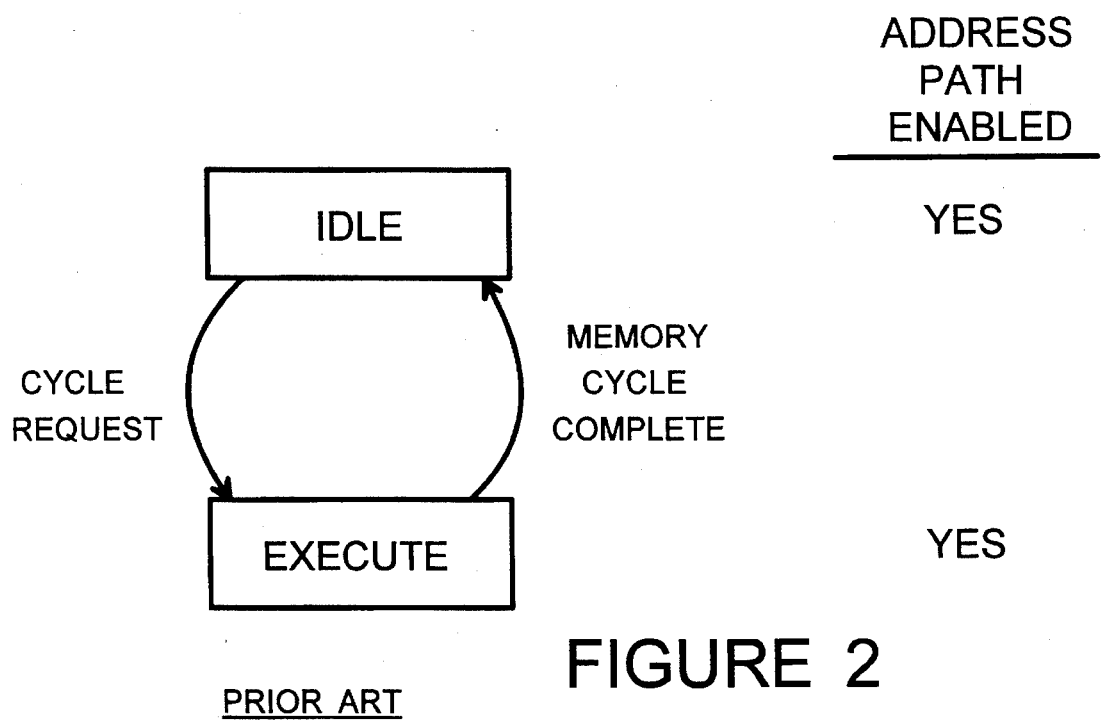
FIG. 2 shows a sequencer flow chart of the memory controller of FIG. 1.

Referring now to FIG. 2 what is shown is a flow chart of the operation of the sequencer 26. As is seen, the address path is always enabled.

Figure 3:
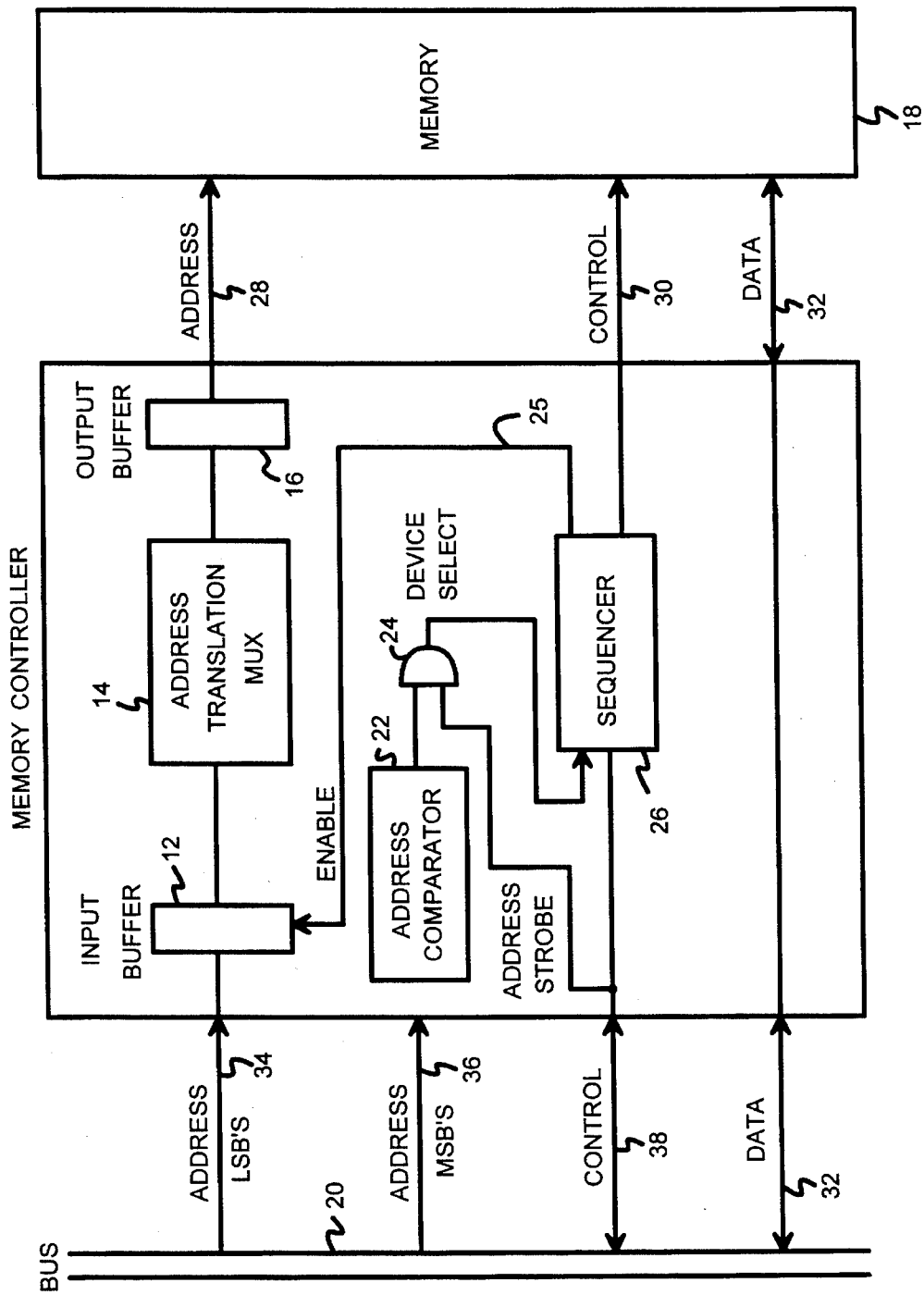
FIG. 3 is the architecture of a second prior art memory controller.

A second prior art implementation of the memory controller 100 is shown in FIG. 3. This embodiment has similar elements to those shown in the memory controller 10 of FIG. 1 except the there is an enable line 25 from the output of the AND gate 24 to the input buffer 12. The line 25 disables the input buffer during memory cycles to eliminate extra power consumption. This implementation has the disadvantage of delaying the point that valid addresses can arrive at the memory 18.

Figure 4:
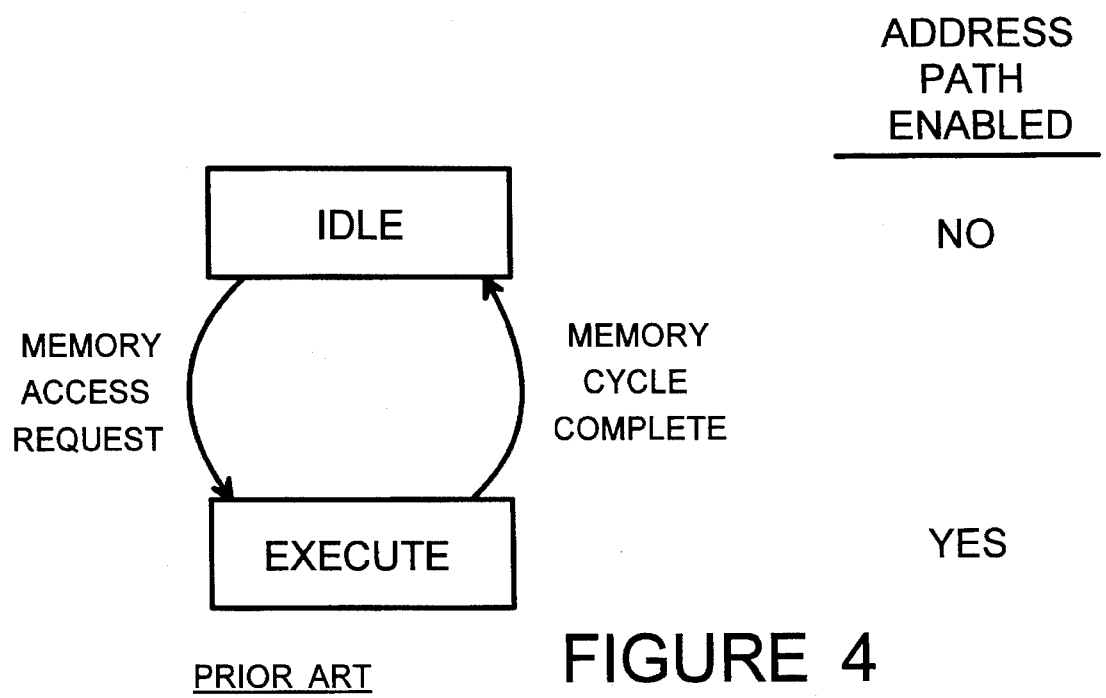
FIG. 4 is a sequencer flow chart of the memory controller of FIG. 3.

Referring now to FIG. 4 what is shown is the sequencer 26 flow chart for the memory controller 100 Accordingly, what is shown is that the address is never enabled in the IDLE state and is enabled when a memory access request is executed. As has been above-mentioned this will delay the point in time that a valid address will arrive at the memory thereby reducing memory bandwidth.

The present invention provides a system within the memory controller for switching between the above mentioned prior art implementations. The present invention takes advantage of the fact that memory accesses oftentimes occur in bursts. Hence, when there are not a burst of memory accesses an increase in memory access length does not consume a significant amount of the bus bandwidth. To more fully understand the present invention refer now to FIGS. 5 and 6.

Figure 5:
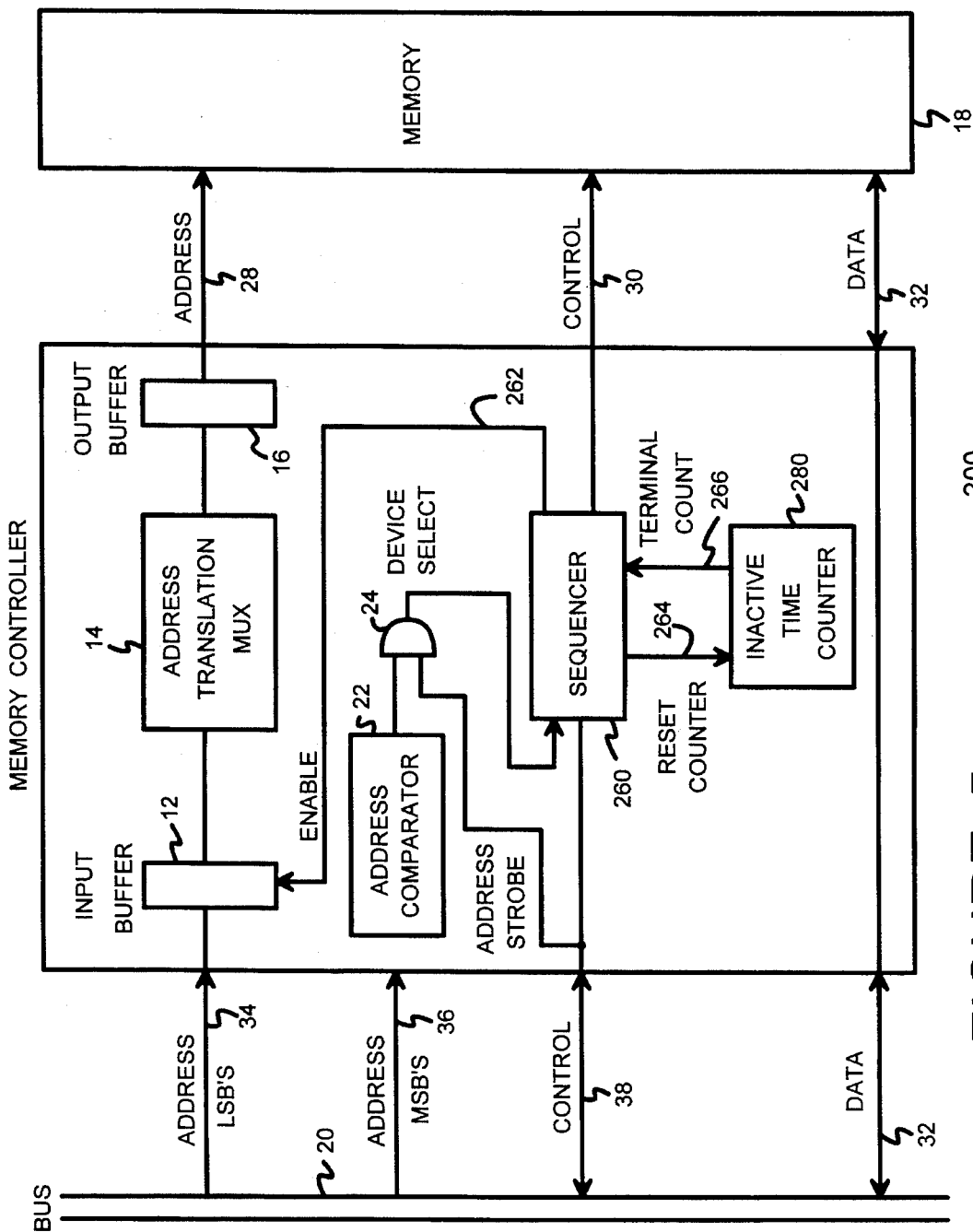
FIG. 5 is a memory controller in accordance with the present invention.

FIG. 5 shows a memory controller 200 in accordance with the present invention. Many of the same elements shown in memory controllers 10 and 100 of FIGS. 1 and 3, respectively are also present in the memory controller 200. The principal differences are that the enable signal comes from the sequencer 260 via line 262 and there is an inactive time counter 280 which is coupled to the sequencer 260.

Figure 6:
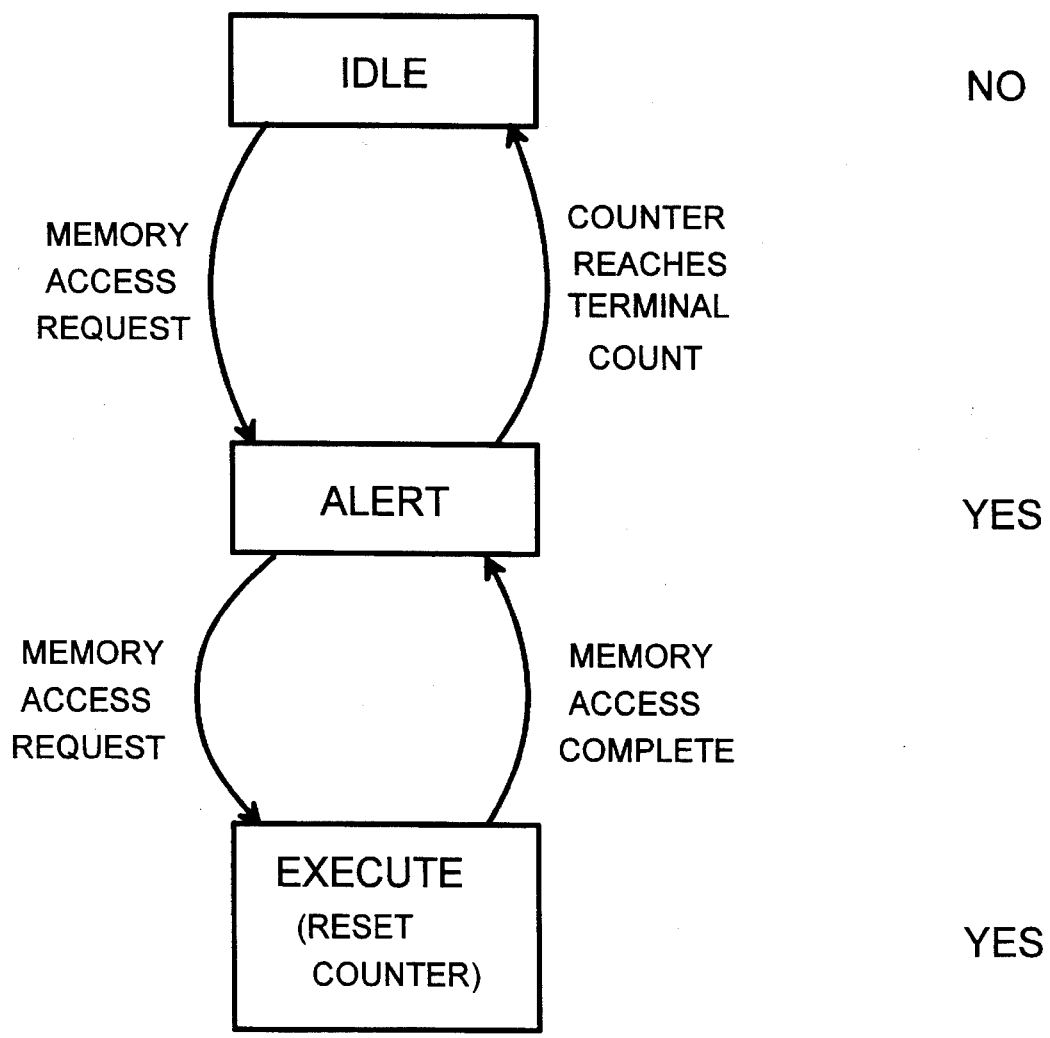
FIG. 6 is a flow chart of the operation of the sequencer and inactive time counter in accordance with the present invention.

Referring now to FIG. 6 what is shown is the flow chart showing the operation of the inactive time counter 280 and the sequencer 260. As is shown, the address path is disabled during the IDLE mode to reduce power consumption. When a memory access is requested by the bus, the sequencer 260 changes to the ALERT mode thereby enabling the input buffer 12 (FIG. 5) via line 262. The sequencer 260 then changes to the EXECUTE mode to perform data transfer. After the transfer is complete the sequencer 260 returns to the ALERT mode and resets the counter 280 via line 264. The counter 280 then begins counting from a first predetermined number (probably 0) to a second predetermined number. If no memory access is requested before the counter 280 reaches the second predetermined count, the sequencer 260 will return to the IDLE mode via line 266 and the input buffer 12 will be disabled. If on the other hand, another access request does occur before the second predetermined number is reached (while in the ALERT mode) then the EXECUTE mode is entered immediately.

The present invention provide a means to save power during periods of inactivity while during those times that there are bursts of memory accesses the memory can be accessed very quickly. For example in the instance that a graphics display is required it has been found that there are long periods of idle time where there can be significant power savings in the IDLE mode. It has similarly been found when graphics objects are rendered, many accesses are usually required during a short period, thereby the ALERT mode significantly reduces access time.

Although the present invention has been described in accordance with the embodiments shown in the figures, one of ordinary skill in the art recognizes there could be variations to the embodiments and those variations would be within the spirit and scope of the present invention. Accordingly, many modifications may be made by one of ordinary skills in the art without departing from the spirit and scope of present invention, the scope of which is defined solely by the appended claims.

I claim:

1. A system for conserving power within a memory controller coupled to a memory, the memory controller including an input data path for receiving address information from a data bus, the system comprising:

an input buffer for receiving address information from the data bus and providing the address information on the data path;

a translator means coupled to the input buffer for translating the address information;

an output buffer coupled to the translator means for providing the translated address information to the memory;

a sequencer means for providing control signals to the memory, the sequencer means also having first, second and third modes of operations, the sequencer means being coupled to the input buffer, the first mode for disabling the input buffer, the second mode for enabling the input buffer and the third mode for allowing for the transfer of data on the data path;

counter means coupled to the sequencer means, the counter means responsive to a signal from the sequencer means indicating that a data transfer operation is complete and the sequencer has returned to the second mode, is reset and begins counting from a first predetermined number to a second predetermined number, if no additional memory access is requested by the data bus before the second predetermined number is reached then the sequencer means returns to the first mode, if another memory access is requested then the sequencer means returns to the third mode.

2. The system of claim 1 in which the first mode is an IDLE mode.

3. The system of claim 1 in which the third mode is an ALERT mode.

4. The system of claim 1 in which the third mode is an EXECUTE mode.

5. The system of claim 1 in which the counter means comprises an inactive time counter.

6. A system for conserving power within a memory controller coupled to a memory, the memory controller including an input data path for receiving address information from a data bus, the system comprising:

an input buffer for receiving address information from the data bus and providing the address information on the data path;

a translator means coupled to the input buffer for translating the address information;

an output buffer coupled to the translator means coupled to the translated address information to the memory;

a sequencer means for providing control signals to the memory, the sequencer means also having an IDLE mode, an ALERT mode and an EXECUTE mode, the sequencer means being coupled to the input buffer, the IDLE mode for disabling the input buffer, the ALERT mode for enabling the input buffer and the EXECUTE mode for allowing for the transfer of data on the data path;

an inactive time counter coupled to the sequencer means, the inactive time counter responsive to a signal from the sequencer means indicating that a data transfer operation is complete and the sequencer has returned to the ALERT mode, is reset and begins counting from a first predetermined number to a second predetermined number, if no additional memory access is requested by the data bus before the second predetermined number is reached then the sequencer means returns to the IDLE mode, if another memory access is requested then the sequencer means returns to the EXECUTE mode.

\* \* \* \* \*